United States Patent [19]

McAlexander, III et al.

[11] 4,239,993
[45] Dec. 16, 1980

[54] HIGH PERFORMANCE DYNAMIC SENSE AMPLIFIER WITH ACTIVE LOADS

[75] Inventors: Joseph C. McAlexander, III, Sugar Land; Lionel S. White, Jr.; G. R. Mohan Rao, both of Houston, all of Tex.

[73] Assignee: Texas Instruments Incorporated, Dallas, Tex.

[21] Appl. No.: 944,822

[22] Filed: Sep. 22, 1978

[51] Int. Cl.³ .................. H03K 5/24; H03K 3/356; G11C 7/00
[52] U.S. Cl. .................. 307/355; 307/279; 307/DIG. 3; 365/205
[58] Field of Search .................. 307/355, 362, DIG. 3, 307/279, 238; 365/203, 205

[56] References Cited

U.S. PATENT DOCUMENTS

| | | | |
|---|---|---|---|
| 3,909,631 | 9/1975 | Kitigawa | 307/DIG. 3 X |
| 3,949,381 | 4/1976 | Dennard et al. | 307/DIG. 3 X |
| 4,000,413 | 12/1976 | Wong et al. | 307/DIG. 3 X |
| 4,003,034 | 1/1977 | Au | 307/DIG. 3 X |
| 4,050,061 | 9/1977 | Kitigawa | 307/DIG. 3 X |
| 4,061,999 | 12/1977 | Proebsting et al. | 307/238 X |
| 4,070,590 | 1/1978 | Ieda et al. | 307/355 |
| 4,081,701 | 3/1978 | White, Jr. et al. | 307/355 |
| 4,125,878 | 11/1978 | Watanabe | 307/DIG. 3 X |
| 4,144,590 | 3/1979 | Kitigawa et al. | 307/DIG. 3 X |
| 4,150,311 | 4/1979 | Matsuda et al. | 307/DIG. 3 X |

OTHER PUBLICATIONS

Cassidy et al., *IBM Technical Bulletin*, vol. 20, No. 1, pp. 268–269, 6/1977.
Bishop et al., *IBM Technical Disclosure Bulletin*, vol. 18, No. 4, pp. 1021–1022, 9/1975.
*Electronics* (pub.) (by Kuo et al.), pp. 81–86, 5/13/76.

*Primary Examiner*—Larry N. Anagnos
*Attorney, Agent, or Firm*—John G. Graham

[57] ABSTRACT

A random access read/write MOS memory device consisting of an array of rows and columns of one-transistor memory cells employs a bistable sense amplifier circuit at the center of each column. The sense amplifier is of the dynamic type in that coupling transistors connect the column line halves to the cross-coupled driver transistors. The sources of the driver transistors are connected to ground through a sequentially timed, three step grounding arrangement employing two transistors, one having a dual channel implanted to provide two different threshold voltages. Active load devices connected to the column line halves provide pull-up of the voltage on the one-going column line half to a full Vdd level.

10 Claims, 21 Drawing Figures

HIGH PERFORMANCE DYNAMIC SENSE AMPLIFIER WITH ACTIVE LOADS

BACKGROUND OF THE INVENTION

This invention relates to semiconductor memory devices and more particularly to an improved sense amplifier for an MOS random access read/write memory.

Semiconductor memory devices of the type made by the N-channel silicon-gate MOS process and employing one transistor dynamic cells are now the most widely used in computers and digital equipment. A continuing problem in these devices is the sense amplifier which must detect the small change in voltage on a digit line caused by a cell being addressed. As the number of cells on a digit line increases and the cell size decreases, the ratio of the storage capacitance to the digit line capacitance decreases and so the voltage change decreases. The trend toward use of 5 V. power supplies rather than 12 V. also reduces the signal level. These factors make the performance of the sense amplifier more critical. Also, the continuing trend toward higher speeds and lower power dissipation place additional constraints on the sense amplifier design. Examples of prior sense amplifiers are disclosed in U.S. Pat. Nos. 3,909,631, and 4,050,061 issued to N. Kitagawa, U.S. Pat. No. 4,081,701 issued to White, McAdams and Redwine, and pending applications Ser. No. 682,687, filed May 3, 1976 (refiled June 30, 1978 as Ser. No. 920,755) by Kitagawa and McAlexander, and Ser. No. 691,734, filed June 1, 1976 (refiled June 30, 1978 as Ser. No. 920,756) by Kitagawa and White, all assigned to Texas Instruments, as well as articles in Electronics Magazine, Sept. 13, 1973 at pp. 116-121, Feb. 19, 1976 at pp. 116-121, and May 13, 1976 at pp. 81-86 and U.S. Pat. No. 4,061,999. The prior sense amplifiers have not been adequate for new designs of MOS RAMs of very high density—64K bits, operating on a single 5 V. supply with access times of 100 to 150 nsec. or faster.

It is the principal object of this invention to provide an improved sense amplifier for a high speed MOS RAM, particularly for a very dense array of one-transistor cells. Another object is to provide a sense amplifier which may be used in a dense MOS memory which operates from a low voltage supply such as 5 V.

SUMMARY OF THE INVENTION

In accordance with one embodiment of the invention, a random access read/write MOS memory device consisting of an array of rows and columns of one-transistor memory cells employs a bistable sense amplifier circuit at the center of each column. The sense amplifier is of the dynamic type as seen in U.S. Pat. No. 4,061,999 in that coupling transistors connect the column line halves to the cross-coupled driver transistors. The sources of the driver transistors are connected to ground through a sequentially timed, three step grounding arrangement employing two transistors, similar to application Ser. No. 920,755, one transistor being dual channel implanted to provide two different threshold voltages. Active load devices as in U.S. Pat. No. 4,081,701, connected to the column line halves, provide pull-up of the voltage on the one-going column line half to a full Vdd level.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 4a–14l are graphic representations of voltage vs. time existing at various parts of the circuit of FIG. 3.

DETAILED DESCRIPTION OF SPECIFIC EMBODIMENT

Figure 1:
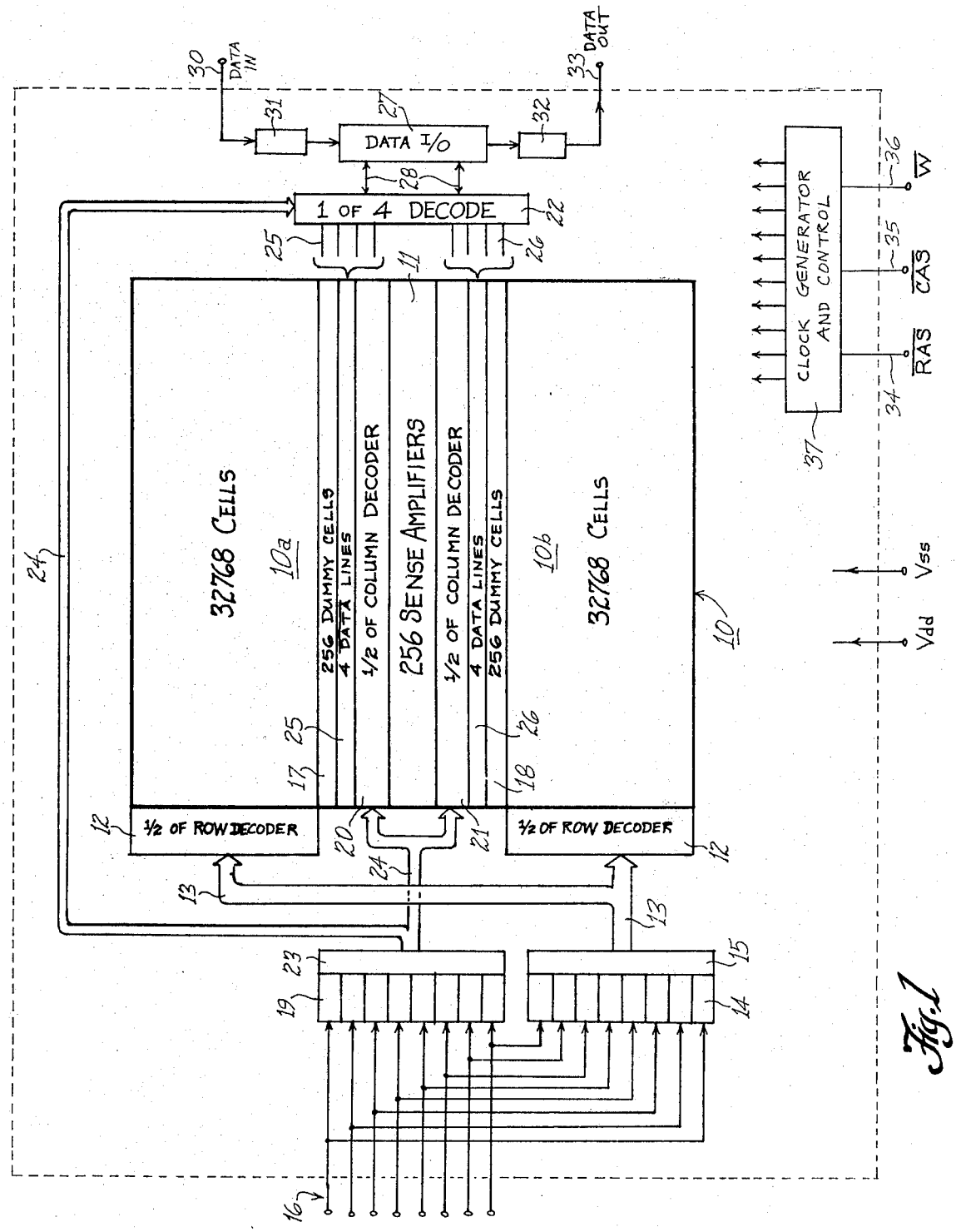
FIG. 1 is an electrical diagram in block form of a semiconductor dynamic memory device which may use the sense amplifiers of the invention.

Referring to FIG. 1, a memory device which may utilize the sense amplifiers of the invention is illustrated in block diagram form. This is a random access, read/write memory of the dynamic type, made by an N-channel, self-aligned, silicon gate MOS process. All of the memory device of FIG. 1 is included in one silicon chip of about 1/30 of a square inch in size which usually would be mounted in a standard dual-in-line package having sixteen pins or terminals. The device includes in this example an array 10 of 65,536 memory cells, with the array split into two halves 10a and 10b of 32,768 cells each, in a regular pattern of 256 rows and 256 columns. Of the 256 row or X lines, there are 128 in the array half 10a and 128 in the half 10b. The 256 column or Y lines are each split in half with one half being in each of the halves 10a and 10b. There are 256 sense amplifiers 11 in the center of the array; these are differential type bistable circuits made according to the invention, and each one is connected in the center of a column line. Thus 128 memory cells are connected to each side of each sense amplifier by a column line half. The chip requires only a single 5 V. supply Vdd, along with a ground terminal Vss. No internal charge pump is needed because no substrate bias is employed.

A row or X address decoder 12, split into two halves, is connected by sixteen lines 13 to eight address buffers or latches 14 via output circuits 15. An eight-bit X address is applied to inputs of the address buffers 14 by eight address input lines 16. The X decoder 12 functions to select one of the 256 row lines as defined by an eight bit address on the input terminals 16; if the selected row line is in the half 10b of the cell array then a row of dummy cells 17 on the opposite side of the sense amplifiers 11 is also activated, while if a line in the half 10a is selected then a row of dummy cells 18 is activated. The address signals on the input lines 16 are multiplexed; the Y address is also applied to these input lines and is latched into a set of eight buffers 19, from which it is applied to column decoders 20, 21 and 22 via output circuits 23 and lines 24. A one-of-64 selection is made by the column decoders 20 and 21, so that one group of four columns is connected to sets of four data and data bar lines 25 and 26, based on six bits of the eight bit Y address. A one-of-four decoder 22 selects one pair of the four pairs of lines 25 and 26, based on two bits of the eight bit Y address, and connects the selected pair to a data I/O control circuit 27 via a pair of lines 28. A single bit data input is applied by an input terminal 30 to a data input latch 31, and the output of this latch is coupled to the data I/O control 27. The latch 31 may be of the same circuit design as the address latch circuit 14. One-bit data output is connected from the data I/O control 27 through a buffer 32 to a data out terminal 33.

Figure 2:
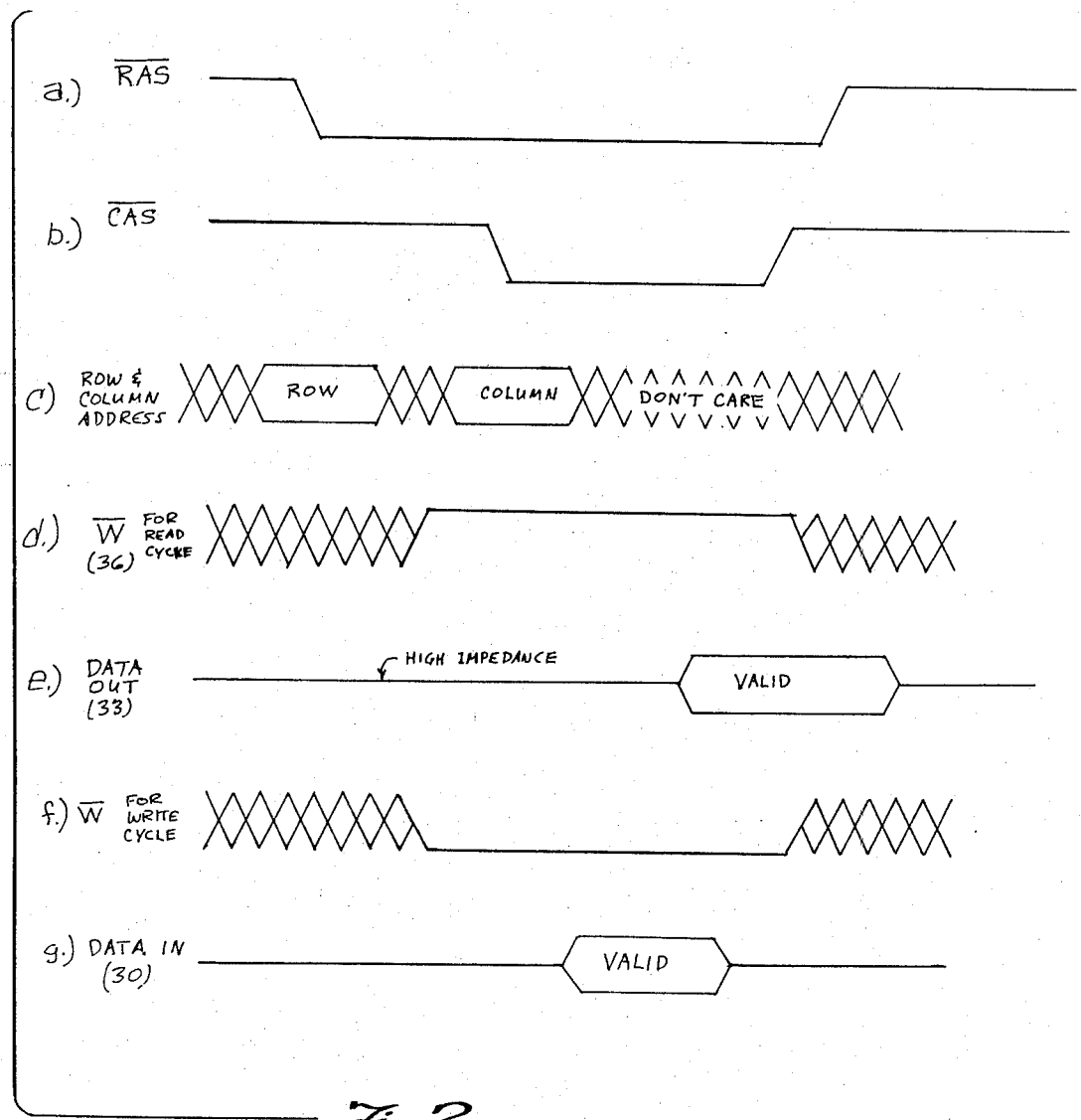
FIGS. 2a–2g are graphic representations of voltage vs. time or other conditions vs. time existing for various parts of the device of FIG. 1.

The X address must appear on the inputs 16 when a row address strobe signal, referred to as $\overline{RAS}$, is applied to an input 34. Likewise, the Y address must appear during a column address strobe signal $\overline{CAS}$ on an input 35. A read/write control $\overline{W}$ on an input 36 is the other control signal for the device. These three inputs are applied to clock generator and control circuitry 37 which generates a large number of clocks and control signals to define the operation of various parts of the device. Whe $\overline{RAS}$ goes low as seen in FIG. 2a, clocks derived from $\overline{RAS}$ cause the buffers 14 to accept and latch the eight bits then appearing on the input lines 16. When $\overline{CAS}$ goes low as seen in FIG. 2b then clocks generated in the circuitry 37 cause the buffers 19 to latch on the Y address on the inputs 16. The row and column addresses must be valid during the time periods shown in FIG. 2c. For a read cycle, the $\overline{W}$ signal on input 36 must be high during the period seen in FIG. 2d, and the output on the terminal 33 will be valid during the time seen in FIG. 2e. For a write cycle, the $\overline{W}$ signal must be low as seen in FIG. 2f and the data-in bit must be valid during the time seen in FIG. 2g.

Figure 3:
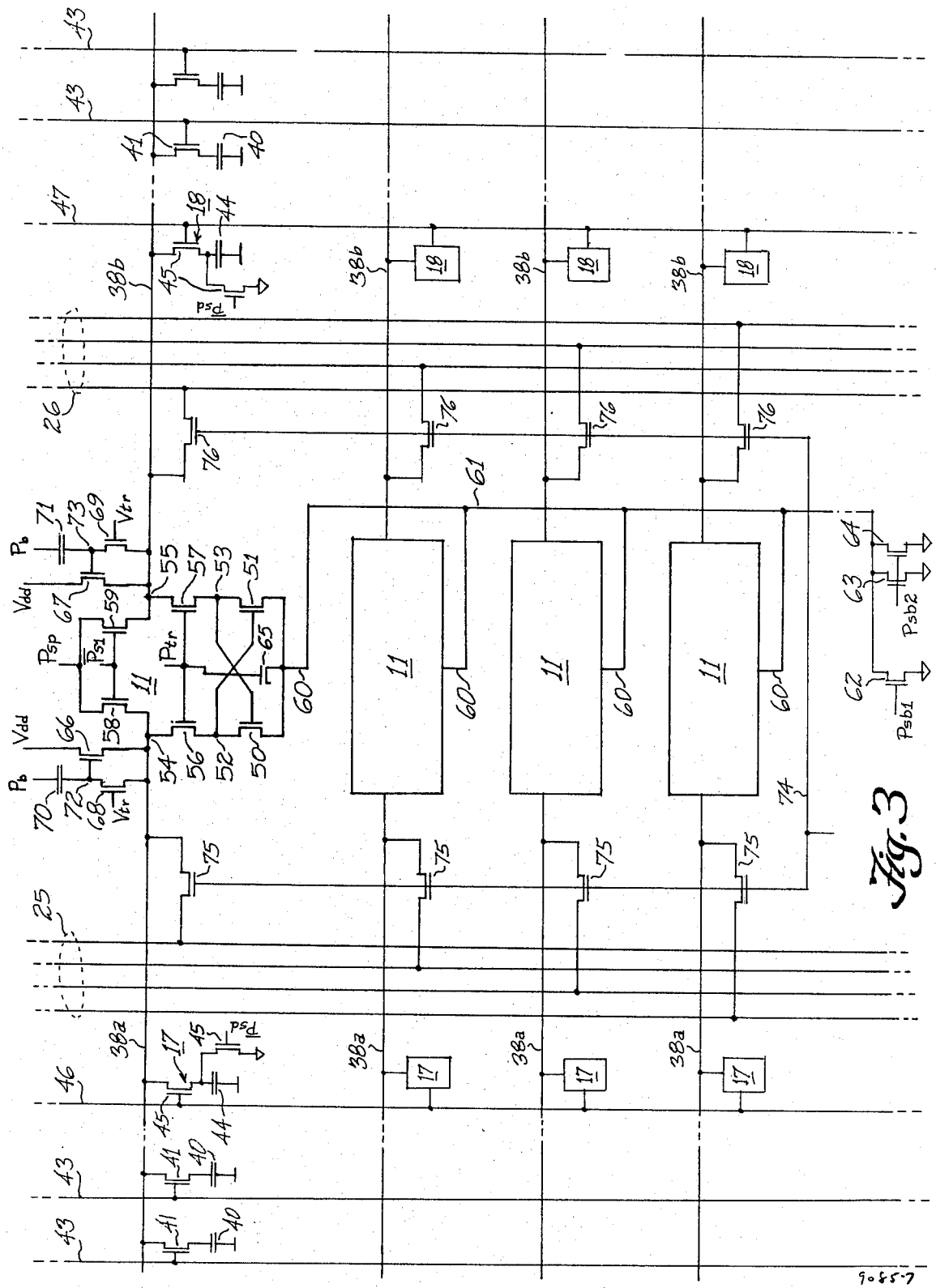
FIG. 3 is an electrical schematic diagram of a part of the device of FIG. 1 showing the sense amplifier of the invention in detail in a memory array.

In FIG. 3, a portion of the cell array is shown in schematic form. Four identical sense amplifiers 11 are positioned at the center of the array, connected to four column line halves 38a or 38b. Sixty-three other sets of four sense amplifiers and column lines are included in the array. Connected to each column line half 38a or 38b are 128 one-transistor cells each having a storage capacitor 40 and a transistor 41. The cells are of the type described in pending U.S. Patent Application Ser. No. 648,594, filed Jan. 12, 1976 and Ser. No. 722,841, filed Sept. 13, 1976, by C-K Kuo, both assigned to Texas Instruments, or U.S. Pat. No. 4,012,757. Row lines 43 are connected to the gates of all of the transistors 41 in each row; there are 256 identical row lines 43 in the array. Also connected to each column line half 38a or 38b is a dummy cell 17 or 18 which consists of a storage capacitor 44 and transistors 45. The gates of all dummy cells in a row are connected to a line 46 or 47. When the X address selects one of the lines 43 on the left, the associated transistor 41 is turned on to connect the capacitor 40 for this selected cell to the column line half 38a, while at the same time the dummy cell select line 47 on the opposite side is activated, connecting the capacitor 44 in one of the cells 18 to the column line storage cell capacitance 40. The dummy cell is precharged to a logic zero before every active cycle.

Figure 4:
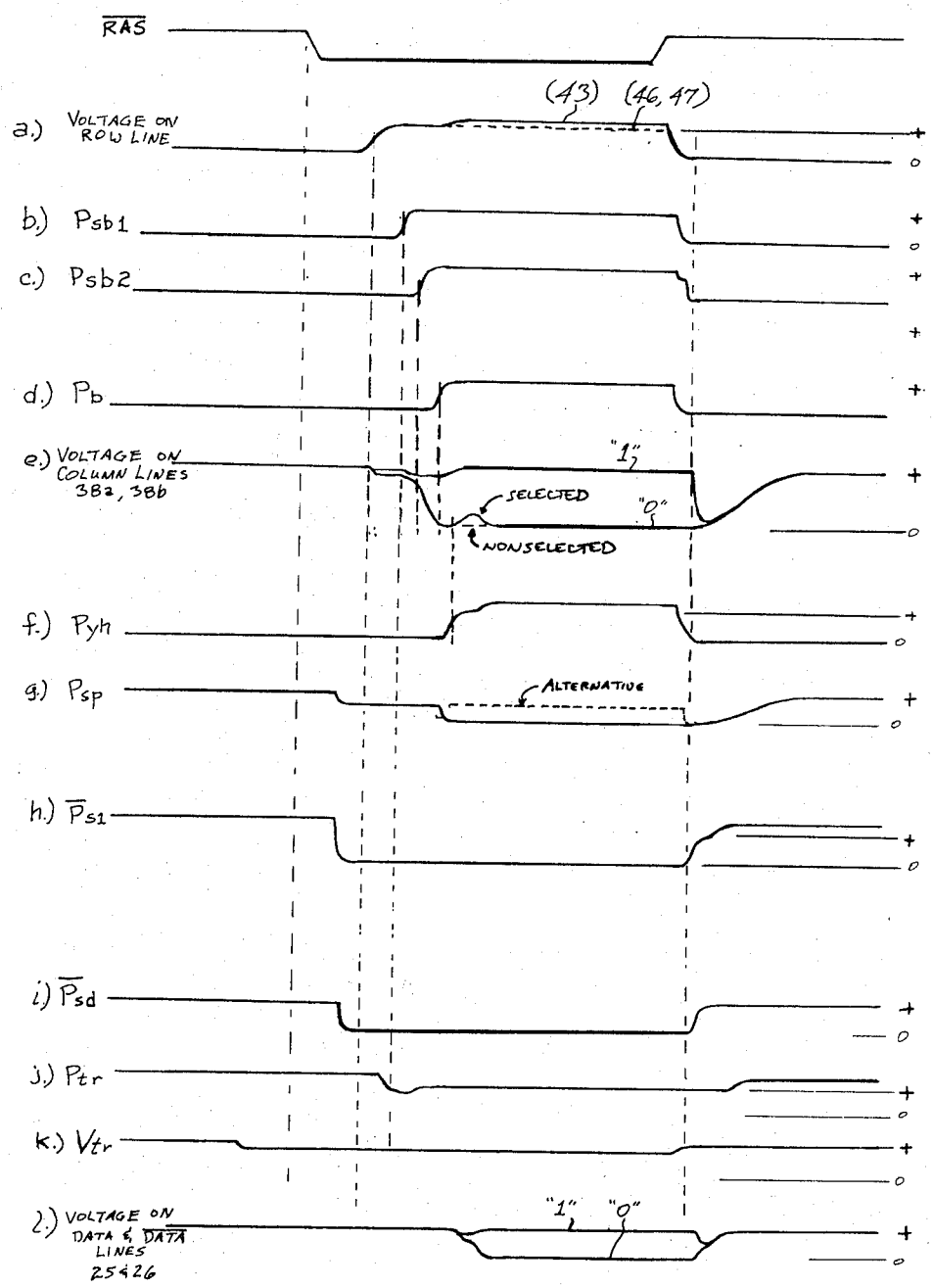

According to the invention, the improved sense amplifier consists of a bistable circuit havng a pair of driver transistors 50 and 51, each with its gate connected to the drain 52 or 53 of the other to provide a cross-coupled flip-flop. The drains 53 and 53 are connected to nodes 54 and 55 at the ends of the lines 38a and 38b through the source-to-drain current paths of a pair of coupling transistors 56 and 57. The gates of the transistors 56 and 57 are both connected to a source of a clock voltage Ptr, seen in FIG. 4j, which is above Vdd for most of the cycle then drops to Vdd during the active part of a cycle. The nodes 54 and 55 and column line halves 38a and 38b are precharged through the source-to-drain current paths of a pair of transistors 58 and 59 connected to a voltage source Psp; this voltage source, shown in FIG. 4g, is Vdd during the precharge part of the cycle, drops to an intermediate level, then drops to zero during the active part of the cycle. The gates of the transistors 58 and 59 are connected to a clock voltage Psl seen in FIG. 4h.

The sources of the driver transistors 50 and 51 are connected together at a node 60, and this node 60 is connected by a line 61 to the same node in all of the 256 sense amplifiers 11 in the array. The line 61 is connected to a transistor 62 and a dual channel transistor 63 and 64 which function as grounding paths. The gate of the transistor 62 is connected to a clock Psbl seen in FIG. 4b, and the common gate of the dual transistors 63 and 64 is connected to a clock Psb2 seen in FIG. 4c. This grounding arrangement is similar to that of application Ser. No. 682,687, filed May 3, 1976, refiled June 30, 1978 as Ser. No. 920,755, assigned to Texas Instruments. Instead of using separate clock sources for the dual transistors 63 and 64, however, an important feature is the use of a single clock source. The two current paths of the dual transistor 63 and 64 turn on at different times because the channel area of the transistor 64 is ion implanted to raise its threshold so that it turns on later than the transistor 63 even through the same clock is applied to its gate. The dual transistor 63 and 64 (actually one large transistor with different channel implants) is much larger than the transistor 62, in channel width to length ratio.

As described thus far, operation of the sense amplifier is similar to that of U.S. Pat. No. 4,061,999, as used in the 4027 and 4116 dynamic RAM devices. The column line halves 38a and 38b along with nodes 54 and 55 are precharged to near Vdd during the precharge part of an operating cycle when both Psp and Psl are high. At this time Ptr is high so the nodes 52 and 53 are precharged also. The transistors 50 and 51 are off because the transistors 62–64 are all off, Psbl and Psb2 being low. After Psl has gone low, turning off the transistors 58 and 59, and before Psb1 goes high, an X address reaches one of the lines 43 at the same time that one of the dummy cell address lines 46 or 47 is activated. This causes an imbalance in the voltage on the nodes 54 and 55, and the same differential is coupled to the nodes 52 and 53 because the voltage Ptr is higher than Vdd. The nodes will separate no more than perhaps fifty milivolts at this point. Then, when Psb1 goes high and the small transistor 62 turns on, the sensing operation is initiated and the anodes separate more as the bistable circuit including the transistors 50 and 51 goes toward a stable condition with one transistor conducting and the other cut off. A slight delay from Psb1, the clock Psb2 goes high to complete the sensing operation by latching the bistable circuit and obtaining a good one/zero set on opposing digit lines. By capacitor 65 along with the parasitic capacitances of the transistors 56 and 57, the voltage Ptr is dynamically level shifted from greater than Vdd down to Vdd; the drop in voltage on the node 60 toward Vss as Psb1 then Psb2 go high is coupled to the gates of the transistors 56 and 57. This results in maintenance of a low conductivity channel between nodes 54 and 52 and between nodes 55 and 53, through the transistors 56 and 57. While latching is initially occurring between the transistors 50 and 51, the column lines 38a and 38b are capacitively isolated from the sensing nodes 52 and 53. When one or both of the nodes 52 and 53 falls by one Vt below Ptr, then the channel conductance will increase and the digit lines will follow in accordance with the now determined and latched state of the bistable circuit. Ptr is clamped at Vdd just after Psb2 goes high.

According to the invention, an active pull-up circuit is employed to allow storage of a full Vdd level. This circuit comprises a pair of pull-up transistors 66 and 67 connecting the nodes 54 and 55 to Vdd, along with control transistors 68 and 69 connecting the gates of the transistors 66 and 67 to the nodes 54 and 55, and capacitors 70 and 71 connecting the gates to a boosting clock Pb occurring after Psb2. The gates of the transistors 68 and 69 are connected to a trap voltage Vtr which stays at a level of about 1Vt below Vdd during the active part of the cycle then at Vdd during the precharge part. The details of operation of the active pull-up circuit will be described below.

After the sensing operation is essentially completed and Psb2 has come on to render first the low threshold transistor 63 then after a slight delay the higher threshold transistor 64 conductive, a definite logic one and logic zero are set up on the column lines 38a and 38b. Then, about four ns. after Psb2 goes high, the selected X line is slowly boosted to a level of Vdd+Vt to permit restoration of a full Vdd level in the capacitor 40 for the selected cell. The voltage on the dummy cell select line 46 or 47 is not boosted because the dummy cell capacitor 44 never stores a one; it is always discharged or at logic zero. At the same time the X line 43 is being boosted, the clock Pb goes high to activate the active load circuits. The clock Pb causes level shift at either node 72 or 73 via the gated capacitors 70 and 71. Only one of these nodes will have retained a logic one because the column lines will be near the one/zero set at this time; conduction through the transistors 68 or 69 for the zerogoing side will discharge node 72 or 73 and cause the gated capacitor 70 or 71 to exhibit very little capacitance so Pb will not charge the node 72 or 73 for this side. The other node 72 or 73 which retained a one, at near Vdd, will be shifted to greater than Vdd thereby allowing this column line half to be pulled back up to Vdd through transistor 66 or 67. At the same time as Pb occurs, the clock Psp is pulled to Vss.

Selection of one group of four of the 256 column lines 38a and 38b by a Pyh voltage occurs a slight delay from when Psb2 goes high. This ensures quiet sensing because only sensing signals occur in the vicinity of the sense amplifier during the critical time of the sensing operation. The one-of-64 column decoder 20 and 21, physically located in the space between the sense amplifiers 11 and the data and data bar lines 25 and 26, produces only one Pyh signal on a line 74 to activate only one set of four transistors 75 coupling nodes 54 to lines 25 and one set of four transistors 76 coupling nodes 55 to lines 26. The remaining sixty-three sets of sense amplifiers 11, although operative for refresh on every read or write cycle, will not be coupled to the data and data bar lines because the Pyh signal on the line 74 will be low for these.

Upon completion of the active portion of a read or write cycle, the precharge portion of the cycle is activated by $\overline{RAS}$ going high. The selected X line 43 and dummy cell line 46 or 47 are first pulled low to isolate the selected bit cells and dummy cells. $\overline{Ps1}$ goes high toward Vdd, shorting the column lines 38a and 38b to Psp, rapidly equalizing the voltages on the anodes 54 and 55 via Psp, through the transistors 58 and 59 to a voltage slightly above Vss. A slight overlap between turning on transistor 58 and 59 by $\overline{Ps1}$ and bringing Psp high promotes rapid equalization at near Vss. Then, as Psp is pulled back to a full Vdd, and the column lines 38a and 38b also are pulled back up to Vdd, $\overline{Ps1}$ is boosted above Vdd, promoting equalization as the node 54 and 55 voltages increase. The capacitors 44 in the dummy cells are discharged to Vss by $\overline{Psd}$ going to Vdd. The clocks Psb1 and Psb2 are pulled low just prior to equalization of the column lines 38a and 38b. The subsequent precharging of the column lines 38a and 38b and the nodes 52, 53 and 60 boost Ptr to greater than Vdd through transistors 56 and 57. Pb is pulled low also prior to equalization so that no interference is injected into the sense amplifier precharge balance operation. Vtr is precharged to Vdd and at the start of the active portion of the cycle, Vtr is pulled to less than Vdd to ensure that the active loads remain totally inactive until one of the column lines 38a or 38b falls to Vdd-2Vt and also ensures that additional parasitic capacitances on the nodes 72 and 73 are not seen by the column lines 38a and 38b until after the sense amplifier latching has occurred.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore contemplated that the appended claims will cover any such modifications or embodiments as fall within the truce scope of the invention.

What is claimed is:

1. A sense amplifier for a semiconductor memory device of the type having an array of rows and columns of memory cells with each column split into two column line halves and sense amplifiers connected to pairs of sense nodes at the ends of each pair of column line havles, comprising:
   a pair of cross-coupled driver transistors, a pair of coupling transistors, at least one grounding transistor and a pair of pull-up transistors, each of the transistors having a current path and a control electrode,
   means connecting the current path of each of the coupling transistors in series with the current path of a separate one of the driver transistors between one of the sense nodes and a grounding node and connecting the current path of said at least one grounding transistor between the grounding node and reference potential,
   the current paths of the pull-up transistors being connected separately between the sense nodes and a supply of a given voltage level,
   means for precharging the sense nodes to said voltage level prior to an active operating cycle,
   means for addressing a selected row of the memory cells in the array at a given time in the beginning of said operating cycle at a voltage of said voltage level,
   means for applying a clock voltage to turn on said at least one grounding transistor at a first time subsequent to the said given time in the beginning of an active operating cycle,
   coupling means separately connecting the control electrodes of the pull-up transistors to the sense nodes, the coupling means being conductive only for a given voltage differential during the active operating cycle, means to boost the voltage on the control electrode of one of the pull-up transistors to higher than said voltage level at a time in the active operating cycle just following the second time, means to maintain the voltage on the control electrodes of the coupling transistors at higher than said voltage level prior to the beginning of active operating cycle and shifting the level of said voltage level during the active operating cycle, and means for addressing said selected row of the memory cells at a voltage higher than said voltage level at a time during said active cycle after said first time.

2. A sense amplifier according to claim 1 wherein the memory cells are of the dynamic type each having one transistor and one storage capacitor.

3. A sense amplifier according to claim 2 wherein all of said transistors are insulated gate field effect ransistors, the current path of each of the transistors being a source-to-drain path and the control electrode being a gate.

4. A sense amplifier according to claim 3 wherein the coupling means are insulated gate field effect transistors, and a voltage is applied to the control electrodes thereof to define the conductivity thereof.

5. A sense amplifier according to claim 4 wherein said voltage differential is about two threshold voltages for the field effect transistors.

6. A sense amplifier according to claim 1 wherein said at least one grounding transistor includes a second transistor having a dual channel current path, one part of the channel turning on prior to the other part of the channel.

7. A sense amplifier according to claim 6 wherein the dual channel is created by different ion implants.

8. A sense amplifier according to claim 1 wherein the voltage on the control electrodes of the coupling transistors is higher than said voltage level until said first time in an active operating cycle.

9. A sense amplifier according to claim 1 wherein the means for precharging comprises a pair of precharge transistors having current paths separately connecting a precharge node to said sense nodes.

10. A sense amplifier according to claim 9 wherein the precharge node varies in voltage from said voltage level to an intermediate level then to reference potential during an active operating cycle then slowly rises back to said voltage level after an active operating cycle.

* * * * *

UNITED STATES PATENT AND TRADEMARK OFFICE
CERTIFICATE OF CORRECTION

PATENT NO. : 4,239,993

DATED : December 16, 1980

INVENTOR(S) : Joseph C. McAlexander, Lionel S. White, Jr. & G.R. Mohan Rao

It is certified that error appears in the above-identified patent and that said Letters Patent are hereby corrected as shown below:

Col. 3, line 60, change "53 and 53" to --52 and 53--.
Col. 4, line 26, change "through" to --though--.
Col. 4, line 30, after "ratio." insert --Alternatively, the channel length of 64 would be longer than that of 63.
Col. 4, line 50, change "anodes" to --nodes--.
Col. 6, line 38, (claim 1), change "havles" to --halves--.
Col. 7, line 18, (claim 3), change "ransistors," to --transistors,--

Signed and Sealed this

Twenty-seventh Day of March 1984

[SEAL]

Attest:

GERALD J. MOSSINGHOFF

Attesting Officer      Commissioner of Patents and Trademarks